US006429690B1

(12) United States Patent
Castellucci et al.

(10) Patent No.: US 6,429,690 B1
(45) Date of Patent: Aug. 6, 2002

(54) PROGRAMMABLE LINEAR TRANSCONDUCTOR CIRCUIT

(75) Inventors: Gregg R. Castellucci, Plattsburgh, NY (US); Kevin B. Ohlson, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/682,950

(22) Filed: Nov. 2, 2001

(51) Int. Cl.[7] .......................... H03K 17/16; G11B 5/03
(52) U.S. Cl. ...................... 326/115; 326/22-27; 326/23; 326/115; 330/252; 360/66
(58) Field of Search ............................ 326/22, 23, 26, 326/27, 83, 115

(56) References Cited

U.S. PATENT DOCUMENTS

| 5,225,790 | A |   | 7/1993  | Noguchi et al. |         |
|-----------|---|---|---------|----------------|---------|
| 5,432,474 | A |   | 7/1995  | Lauffenburger et al. |   |
| 5,463,349 | A |   | 10/1995 | Petersen et al. |        |
| 5,528,179 | A | * | 6/1996  | Siniscalchi et al. | 327/103 |
| 5,559,470 | A |   | 9/1996  | Laber et al. |           |
| 5,828,232 | A | * | 10/1998 | White | 326/83 |
| 5,886,579 | A |   | 3/1999  | Mangelsdorf |            |
| 6,037,838 | A |   | 3/2000  | Marchese et al. |        |
| 6,046,875 | A |   | 4/2000  | Siniscalchi et al. |     |
| 6,104,242 | A | * | 8/2000  | Ezell | 330/252 |
| 6,122,127 | A | * | 9/2000  | Flinsbaugh | 360/66 |
| 6,069,866 | A1 |  | 5/2001  | Pietruszynski et al. |   |

\* cited by examiner

Primary Examiner—Michael Tokar
Assistant Examiner—Vibol Tan
(74) Attorney, Agent, or Firm—Richard A. Henkler; Bracewell & Patterson, L.L.P.

(57) ABSTRACT

A programmable linear transconductor circuit is disclosed. The programmable linear transconductor circuit includes a first current source and a second current source, a first group of transistors and a second group of transistors, a first load coupled to the first group of transistors, and a second load coupled to the second group of transistors, and a first group of switches and a second group of switches. Each switch in the first group of switches is selectively connected to a transistor from the first group of transistors to the first current source or the second current source. Similarly, each switch in the second group of switches is selectively connected to a transistor from the second group of transistors to the first current source or the second current source, accordingly.

10 Claims, 4 Drawing Sheets

… …

PROGRAMMABLE LINEAR TRANSCONDUCTOR CIRCUIT

BACKGROUND OF THE INVENTION

1. Technical Field

The present invention relates to a logic circuits in general, and in particular to transconductor circuits. Still more particularly, the present invention relates to a programmable linear transconductor circuit.

2. Description of the Prior Art

A hard drive typically includes a preamplifier, a read channel, a write channel, a servo controller, a motor control circuit, a read-only memory (ROM), a random-access memory (RAM), and a variety of disk control circuitry for controlling various operations of the hard drive. Generally speaking, the read channel of a hard drive requires a low-pass filter circuit for reducing wideband noise and for shaping readback signals. Such low-pass filter, which is also a continuous-time filter (CTF) located at the front-end of a read channel, is commonly built from a number of tunable transconductance stages. Each transconductance stage includes an operational transconductance amplifier (OTA).

The cutoff frequency of a $g_m*C$ filter is proportional to the product of the transconductance, $g_m$, and the load capacitance, C, of all the OTA transconductors within the $g_m*C$ filter. For read channel applications, the cutoff frequency of a $g_m*C$ filter must be programmable over at least a 3-to-1 range in two separate modes of operation, namely, a servo mode and a read mode. The two modes of operation require the cutoff frequency range of a $g_m*C$ filter to be at least a 5-to-1 ratio. For example, a read channel has an overall cutoff frequency range of 30 MHz to 200 MHz. In order to achieve the above-mentioned cutoff frequency range, a 6-bit current digital-to-analog converter (DAC) is programmed to adjust to tail currents in the OTA transconductors over a range of about 10-to-1. The present disclosure describes a programmable linear transconductor circuit to be utilized in a $g_m*C$ filter within a read channel of a hard drive.

BRIEF SUMMARY OF THE INVENTION

In accordance with a preferred embodiment of the present invention, a linear transconductor circuit includes a first current source and a second current source, a first group of transistors and a second group of transistors, a first load coupled to the first group of transistors, and a second load coupled to the second group of transistors, and a first group of switches and a second group of switches. Each switch in the first group of switches is selectively connected to a transistor from the first group of transistors to the first current source or the second current source. Similarly, each switch in the second group of switches is selectively connected to a transistor from the second group of transistors to the first current source or the second current source, accordingly.

All objects, features, and advantages of the present invention will become apparent in the following detailed written description.

BRIEF DESCRIPTION OF THE SEVERAL VIEWS OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF THE INVENTION

DETAILED DESCRIPTION OF A PREFERRED EMBODIMENT

The linear transconductor circuit of the present invention is illustrated in a low-pass filter within a read channel of a hard drive. However, the linear transconductor circuit of the present invention may also be used in other applications.

For any differential pair amplifier, the differential current, $+I-\Delta I$, is proportional to, the differential input voltage, $+V_{in}-\Delta V_{in}$ times the small signal transconductance, $g_m$, of the transistors used. The small signal $g_m$ of a metal-oxide semiconductor (MOS) transistor is defined as $dI_{out}/dV_{in}$, and is proportional to the drawn width divided by the drawn length (W/L) of the MOS transistor. Transconductance $g_m$ is also proportional to the drain current, $I_{drain}$, of the MOS transistor. Due to the physical and electrical characteristics of a MOS transistor, the differential current is linearly proportional to the differential input voltage for only a limited range of $V_{in}$.

Figure 1:
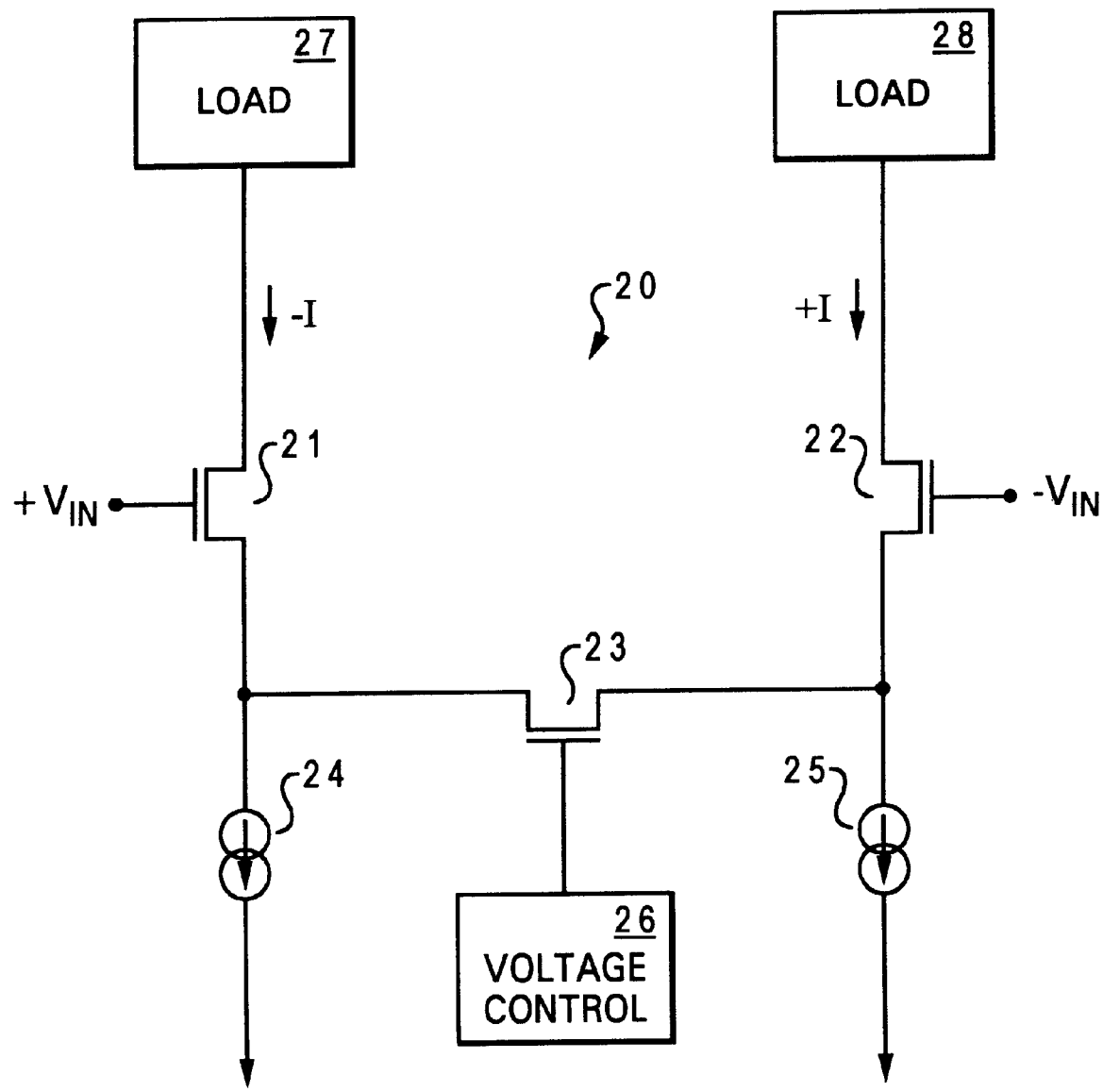
FIG. 1 is a schematic diagram of a first transconductor circuit according to the art.

Referring to drawings and in particular FIG. 1, there is depicted a schematic diagram of a first transconductor circuit according to prior art. As shown a transconductor circuit 20 includes differential pair devices 21–22, current sources 24–25, loads 27–28, a voltage control block 26, and a source degeneration device 23. The gate of source degeneration device 23 is controlled by voltage control block 26 so that source degeneration device 23 operates in its triode state and acts as a variable resistor. As input voltage $+V_{in}-\Delta V_{in}$ varies modulating $+I-\Delta I$, some current is shunted through source degeneration device 23 rather than differential pair devices 21 and 22, thereby reducing the effective transconductance of differential pair devices 21 and 22. Transconductor circuit 20 is typically used as transconductance amplifiers for automatic voltage gain control amplifiers. There are drawbacks when using transconductor circuit 20. One drawback is that the linear operation of differential pair devices 21 and 22 is limited by the linear range of their transconductance. Another drawback is that setting voltage control block 26 to control the amplifier transconductance to a predictable value is difficult since the effective transconductance of the amplifier depends on the characteristics of differential pair devices 21 and 22 plus the triode operation of source degeneration device 23 as a function of its gate voltage.

Figure 2:
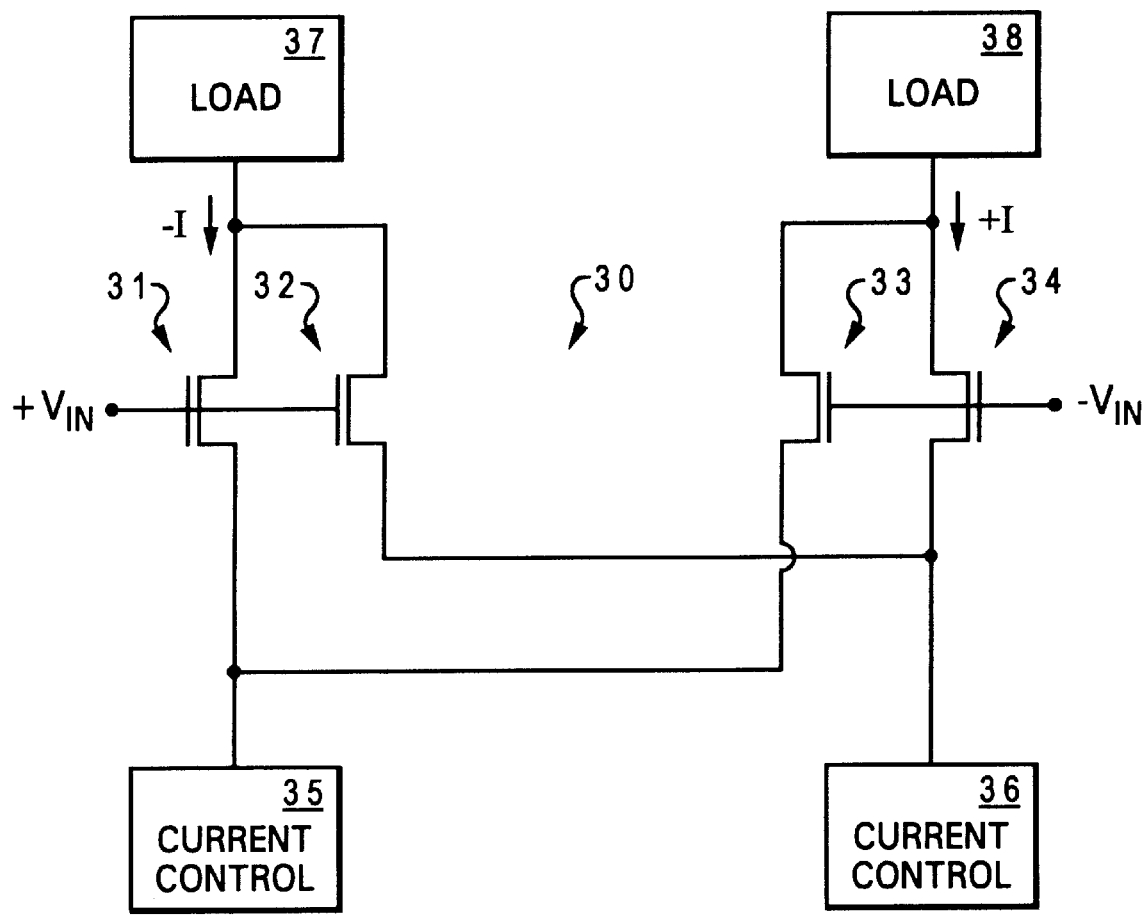
FIG. 2 is a schematic diagram of a second transconductor circuit according to the prior art.

The problem of limited linear range of amplifier transconductance can be improved by using a linearizing technique implemented in a second transconductor circuit illustrated in FIG. 2. By cross coupling input devices of a differential input, additional linear range of transconductance can be achieved. Small signal transconductance is still a function of W/L and drain current Idrain of a transistor, but is reduced proportionately to the amount of cross coupling in a transistor pair. There is also an ideal cross coupling ratio that maximizes the linear operation of the differential pair at the expense of transconductance as compared to transconductor circuit 20 of FIG. 1 (given equal device area and bias current).

With reference now to FIG. 2, there is illustrated a schematic diagram of a second transconductor circuit according to the prior art. As shown, a linear transconductor circuit 30 includes transistors 31–34, controllable current sources 35–36, and loads 37–38. A cross-coupled device pair is used in transconductor circuit 30. Let the channel lengths of transistors 31 and 32 be equal. The sum of the channel width of transistors 31 and 32 equals the sum of the channel width of transistors 33 and 34. The amount of linearization is determined by the ratio of the widths on each side, which is typically from 4:1 to 6:1. Thus, by setting the total width of transistors 31 and 32 equals to the total width of transistors 33 and 34, and by selecting the ratio of width of transistor 32 to width of transistor 31 (i.e., $width_{32}/width_{31}$) equals the ratio of widths of transistor 34 to width of transistor 33 (i.e., $width_{34}/width_{33}$) can correctly maximize the linear operation range of the amplifier. A differential voltage, $+V_{in}-V_{in}$ is applied to the gates of transistors 31–34. The differential current $+I-I$ supplied to the loads is proportional to $+V_{in}-V_{in}$ times the small signal transconductance of transistors 31–34. The transconductance of transconductor circuit 30 is programmable by varying the tail currents supplied by current controls 35–36. Transistor theory shows that the transconductance transistors 31–34 is proportional to the square root of tail current $I_d$. Transconductance $g_m$ of transistors processed in modern technology is very nearly linearly proportional to tail current $I_d$. The transconductance, degree of linearization of transconductance circuit 30 is fixed by device size, cross coupling ratio, and range of programmable tail currents. The linearity and transconductance of transconductance circuit 30 can be improved by varying the tail current in the differential pair. The cross-couple ratio of transistors 31–34 is selected as a design trade-off between a desired transconductance $g_m$ and a desired linearization. The design of transconductance circuit 30 may be optimized for best linearization by cross coupling the transistors and thereby reducing small signal transconductance, with transconductance being determined by device width, device length, and drain current (or bias current). Of the above-mentioned parameters, only the drain current can be adjusted during operation. Since transconductance is proportional to the drain current, the penalty for increasing transconductance is an increase in power consumption.

Figure 3:
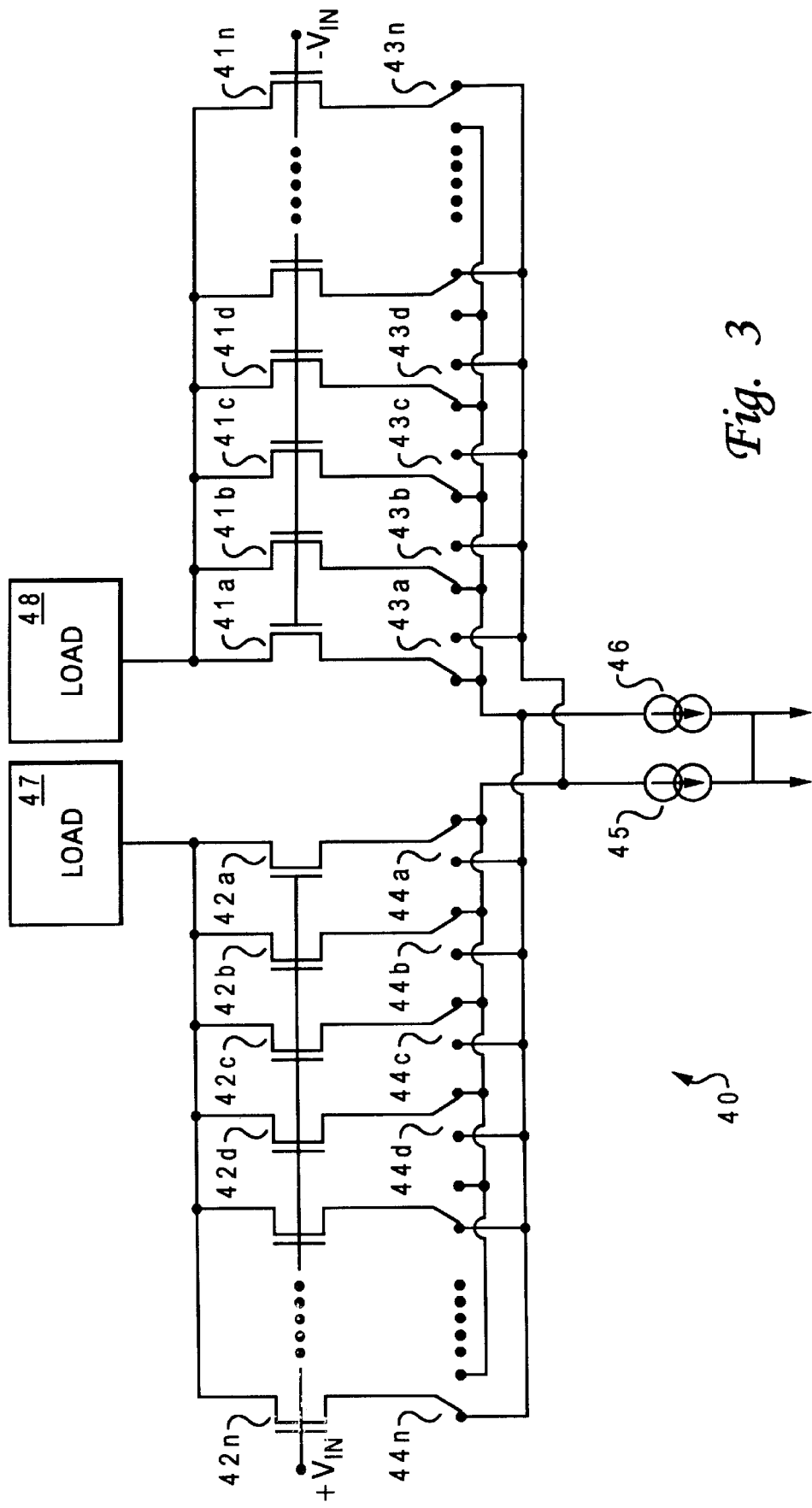
FIG. 3 is a schematic diagram of a linear transconductor circuit in accordance with a preferred embodiment of the present invention.

Referring now to FIG. 3, there is illustrated a schematic diagram of a linear transconductor circuit in accordance with a preferred embodiment of the present invention. As shown, a transconductor circuit 40 includes transistors 41a–41n and 42a–42n, controllable switches 43a–43n and 44a–44n, programmable current sources 45–46, and loads 47–48. Although transistors 41a–41n and 42a–42n are shown as n-channel transistors, transistors 41a–41n and 42a–42n can also be p-channel transistors. A differential voltage, $+V_{in}-V_{in}$, is applied to the gates of transistors 41a–42n and 42a–42n. With the present invention, if the channel lengths of transistors 41a–41n and transistors 42a–42n are identical, then the total width of transistors 41a–41n equals the total width of transistors 42a–42n. As such, the ratio on each side of the input pairs (i.e., transistors 42a–42n on the left side, and transistors 41a–41n on the right side) can be programmed by selectively controlling controllable switches 43a–43n and 44a–44n.

The selection of transistors from each side via controllable switches 43a–43n and 44a–44n should preferably mirror each other. For example, if switch 43a is selected to connect transistor 41a to current source 46, switch 43b is selected to connect transistor 41b to current source 45, switch 43c is selected to connect transistor 41c to current source 45, switch 43d is selected to connect transistor 41d to current source 46, then switch 44a is selected to connect transistor 42a to current source 45, switch 44b is selected to connect transistor 42b to current source 46, switch 44c is selected to connect transistor 43c to current source 46, switch 44d is selected to connect transistor 44d to current source 45.

The selection of device sizes and cross coupling with programmable switches 43a–43n and 44a–44n in the design process allows programming of transconductor circuit 40 to an optimum ratio to provide linearization to the same degree as transconductance circuit 30 (from FIG. 2). By programming switches 43a–43n and 44a–44n to select a cross coupling ratio above and below the optimum value, the transconductance of transconductor circuit 40 may be programmed higher and lower without adjusting bias current such that power consumption will remain the same.

The small signal transconductance of an amplifier having transconductor circuit 40 can be programmable via the cross-coupling selection of controlling switches 43a–43n and 44a–44n and via the tail currents supplied by current sources 45–46. There is still an optimum cross-coupling ratio that maximizes the linear range of transconductance; however, the present invention provides the ability to program transconductance levels without changing tail current and still having a wider linear range than is found with a differential pair as shown in FIG. 1. If desired, the tail current of transconductor circuit 40 may also be programmed for operation similar to transconductor circuit 30 of FIG. 2.

Figure 4:
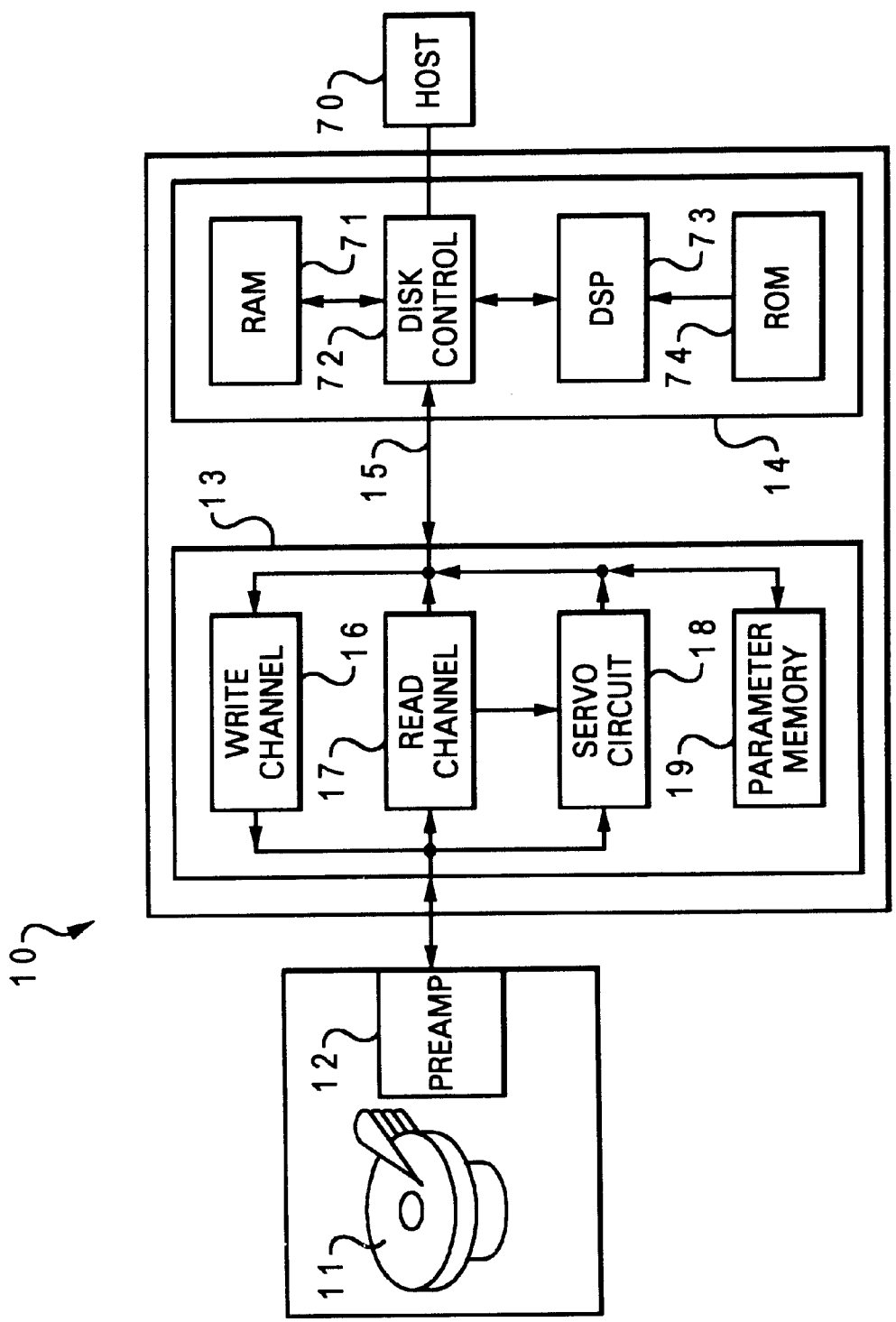
FIG. 4 is a block diagram of a hard drive in which the linear transconductor circuit from FIG. 3 can be applied, in accordance with a preferred embodiment of the present invention.

With reference now to FIG. 4, there is illustrated a block diagram of a hard drive in which linear transconductor circuit 40 from FIG. 3 can be implemented. As shown, a hard drive 10 includes a head assembly 11, a preamplifier 12, a synchronously sampled data (SSD) channel 13, and a control circuitry 14. Head assembly 11 includes a number of rotating magnetic disks (or platters) used to store data represented as magnetic transitions. Preamplifier 12 interfaces between head assembly 11 and SSD channel 13 for providing amplification to analog data signals as needed. SSD channel 13 is used during read and write operations to exchange analog data signals with head assembly 11 and to exchange digital data signals with control circuitry 14 through a data/parameter path 15. SSD channel 13 includes a write channel 16, a read channel 17, a servo circuit 18, and a parameter memory 19. Control circuitry 14 controls various operations of hard drive 10 and exchanges digital data between SSD channel 13 and host 70. Control circuitry 14 includes a processor 73, a disk control 72, a random-access memory (RAM) 71, and a read-only memory (ROM) 74.

During write operations, write channel 16 receives digital data from control circuitry 14 in parallel format through data/parameter path 15. Write channel 16 may include a register, a scrambler, an encoder, a precoder, a serializer, and a write precompensation circuit. The operation and timing of write channel 16 is controlled by a phase locked loop circuit. During read operations, read channel 17 receives analog data signals from head assembly 11 through preamplifier 12.

Read channel 17 conditions, detects, decodes, and formats analog data signals, and ultimately provides a corresponding digital data signal in parallel format to control circuitry 14 through data/parameter path 15.

As has been described, the present invention provides an improved programmable linear transconductor circuit. The transconductance of the prior art transconductor circuit is usually programmed by varying either tail current or by coupling sources of differential pair with a triode field-effect transistor and by controlling its gate voltage. The transconductor circuit of the present invention allows the transconductance of a linear differential transistor pair to be changed without changing the tail current of the differential pair while maintaining a level of linearization to minimize signal distortion. The transconductance of the transconductor circuit can be programmed via logic selection switches. The linear transconductor circuit of the present invention can be used in continuous-time filter (CTF) of a read channel of a hard drive for selecting a coarse bandwidth mode, such as servo mode or data mode, so that the required range of programmed tail currents may be reduced. Because the transconductor circuit of the present invention allows the transconductance to be changed without changing the tail current, the CTF can have a higher filter cutoff frequency while consuming less power.

While the invention has been particularly shown and described with reference to a preferred embodiment, it will be understood by those skilled in the art that various changes in form and detail may be made therein without departing from the spirit and scope of the invention.

What is claimed is:

1. A programmable linear transconductor circuit, comprising:
   a first current source and a second current source;
   a first group of transistors and a second group of transistors;
   a first load coupled to said first group of transistors, and a second load coupled to said second group of transistors;
   a first group of switches, wherein each of said first group of switches is selectively connected to a transistor from said first group of transistors to said first current source or said second current source; and
   a second group of switches, wherein each of said second group of switches is selectively connected to a transistor from said second group of transistors to said first current source or said second current source.

2. The circuit of claim 1, wherein the channel lengths of said first group of transistors and said second group transistors are identical.

3. The circuit of claim 1, wherein the widths of said first group of transistors and said second group transistors are identical.

4. The circuit of claim 1, wherein said first group of transistors and said second group transistors are n-channel transistors.

5. The circuit of claim 1, wherein said first group of transistors and said second group transistors are p-channel transistors.

6. A hard drive comprising: a head assembly; a read channel and a write channel coupled to said head assembly, wherein said read channel includes a programmable linear transconductor circuit, wherein said programmable linear transconductor circuit includes
   a first current source and a second current source;
   a first group of transistors and a second group of transistors;
   a first load coupled to said first group of transistors, and a second load coupled to said second group of transistors;
   a first group of switches, wherein each of said first group of switches is selectively connected to a transistor from said first group of transistors to said first current source or said second current source; and
   a second group of switches, wherein each of said second group of switches is selectively connected to a transistor from said second group of transistors to said first current source or said second current source.

7. The hard drive of claim 6, wherein the channel lengths of said first group of transistors and said second group transistors are identical.

8. The hard drive of claim 6, wherein the widths of said first group of transistors and said second group transistors are identical.

9. The hard drive of claim 6, wherein said first group of transistors and said second group transistors are n-channel transistors.

10. The hard drive of claim 6, wherein said first group of transistors and said second group transistors are p-channel transistors.

* * * * *